United States Patent
Lee

(10) Patent No.: US 8,184,494 B2
(45) Date of Patent: May 22, 2012

(54) CELL INFERIORITY TEST CIRCUIT

(75) Inventor: Joo Hyeon Lee, Bucheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 218 days.

(21) Appl. No.: 12/655,312

(22) Filed: Dec. 29, 2009

(65) Prior Publication Data

US 2010/0246292 A1    Sep. 30, 2010

(30) Foreign Application Priority Data

Mar. 26, 2009 (KR) .................. 10-2009-0026044

(51) Int. Cl.
*G11C 29/00* (2006.01)

(52) U.S. Cl. ............ 365/201; 365/233.1; 365/196; 365/194; 365/230.06

(58) Field of Classification Search .................. 365/201, 365/233.1, 196, 194, 230.06
See application file for complete search history.

(56) References Cited

U.S. PATENT DOCUMENTS

| 7,330,379 B2 | 2/2008 | Motomochi et al. |
| 7,363,555 B2 | 4/2008 | Lee |
| 2003/0085731 A1 * | 5/2003 | Iwase et al. ............ 326/16 |

FOREIGN PATENT DOCUMENTS

| KR | 10-1998-0060723 | 10/1998 |
| KR | 10-2007-0031049 A | 3/2007 |

* cited by examiner

*Primary Examiner* — Thong Q Le
(74) *Attorney, Agent, or Firm* — John P. White; Cooper & Dunham LLP

(57) ABSTRACT

A cell inferiority test circuit includes a compression data generator configured to compress selected data in response to selection signals and to generate compression data including information about cell inferiority, a strobe signal delayer configured to delay a strobe signal by an amount of time set by a test signal and to generate a delayed strobe signal, and an input/output line driver configured to receive the compression data in sync with the delayed strobe signal and to drive a global input/output line.

17 Claims, 4 Drawing Sheets

CELL INFERIORITY TEST CIRCUIT

TECHNICAL FIELD

This disclosure relates to a cell inferiority test circuit of a semiconductor device.

BACKGROUND

With a rapid increase of the integration density of semiconductor memory chips in recent years, more than ten millions of cells are typically integrated in a single memory chip. Increasing number of integrated cells in the chips is inevitably accompanied by an extension of a time for testing defects of cells. For that reason, a general test inferiority test circuit often employs a data compression test mode to shorten a time for testing defects of cells.

Such a data compression test mode means a scheme inputting/outputting data through a part of input/output pins DQ used in a normal mode and coincidentally testing inferiority from a plurality of cells accessed by the same address.

A conventional cell inferiority test circuit using the data compression test mode is configured as follows by referring to FIG. 1.

As shown in FIG. 1, the conventional cell inferiority test circuit generates compression data, which contains information about inferiority of cells, by compressing right data RDATA<1:16> or left data LDATA<1:16> selected in response to the first and second selection signals TPARA<1:2>. The compression data is loaded on a global input/output line GIO in sync with a strobe signal IOSTR.

However, the general cell inferiority test circuit is short of loading performance on the global input/output line GIO because of an insufficient timing margin between the strobe signal IOSTR and the compression data due to PVT variations.

SUMMARY

In an embodiment of this disclosure, a cell inferiority test circuit includes a compression data generator configured to compress selected data in response to selection signals and to generate compression data including information about cell inferiority, a strobe signal delayer configured to delay a strobe signal by an amount of time set by a test signal and to generate a delayed strobe signal, and an input/output line driver configured to receive the compression data in sync with the delayed strobe signal and driving a global input/output line.

In another embodiment of this disclosure, a cell inferiority test circuit includes a first strobe signal delay circuit configured to delay a strobe signal for a first delay period in response to a first test signal, a second strobe signal delay circuit configured to delay an output signal of the first strobe signal delay circuit for a second delay period, in response to a second test signal, and to output a delayed strobe signal, and an input/output line driver configured to receive compression data in sync with the delayed strobe signal and to drive a global input/output line.

BRIEF DESCRIPTION OF THE DRAWINGS

The above and other aspects, features and other advantages will be more clearly understood from the following detailed description taken in conjunction with the accompanying drawings, in which.

DESCRIPTION OF PREFERRED EMBODIMENTS

Hereinafter, embodiments of the present invention will be described with reference to accompanying drawings. However, the embodiments are for illustrative purposes only and are not intended to limit the scope of the invention.

Figure 1:
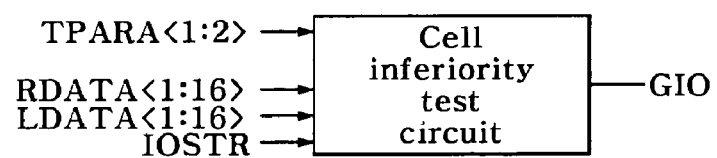
FIG. 1 is a block diagram of a conventional cell test circuit.
Figure 2:
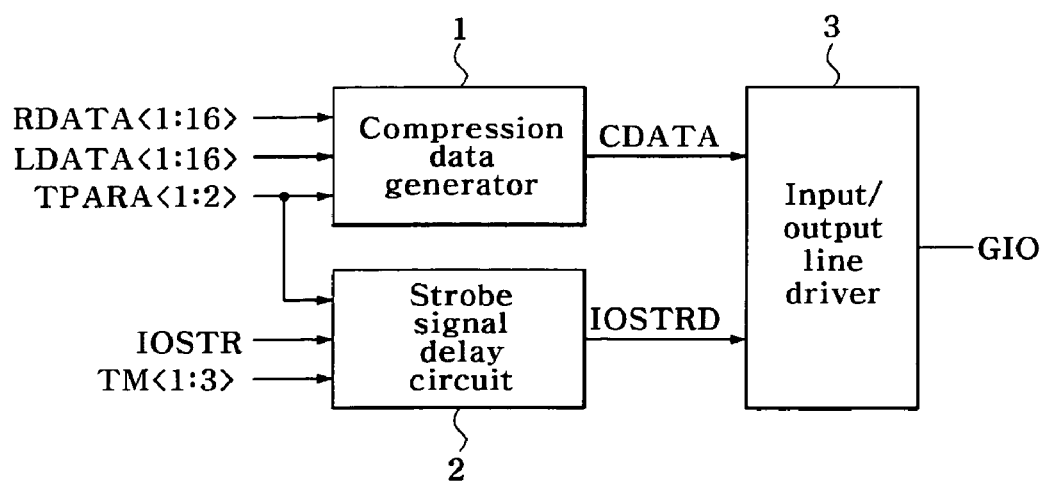
FIG. 2 is a block diagram illustrating a configuration of a cell inferiority test circuit in accordance with an embodiment of this disclosure.

FIG. 2 is a block diagram illustrating a configuration of a cell inferiority test circuit in accordance with an embodiment of this disclosure.

Figure 3:
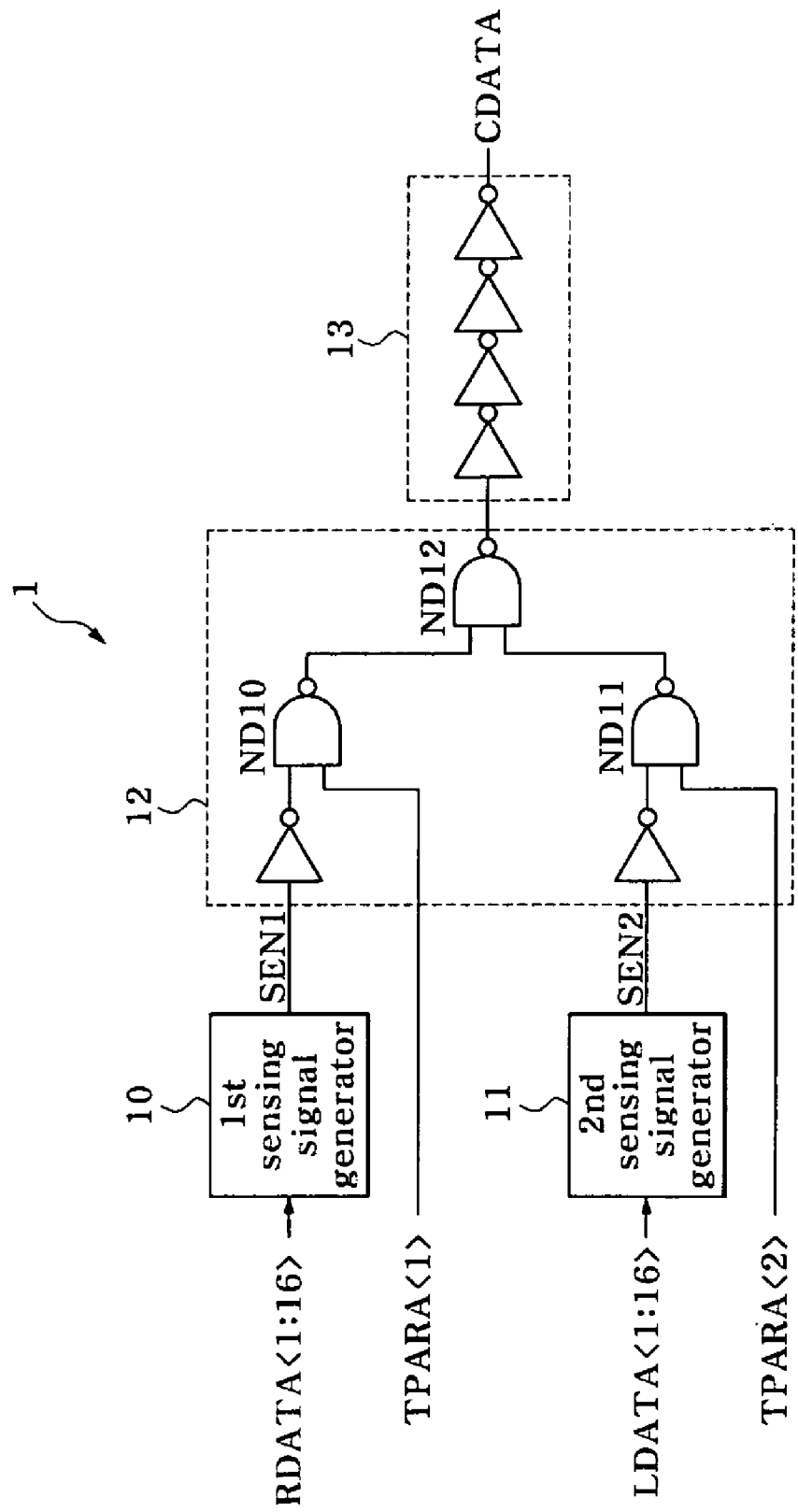
FIG. 3 is a circuit diagram of a compression data generator included in the cell inferiority test circuit shown in FIG. 2.

Referring to FIG. 2, the cell inferiority test circuit according to this embodiment is comprised of a compression data generator 1, a strobe signal delayer 2, and an input/output line driver 3. Referring to FIG. 3, the compression data generator 1 includes a first sensing signal generator 10, a second sensing signal generator 11, a selective transmission circuit 12, and a buffer circuit 13. The first sensing signal generator 10 executes an exclusive-NOR operation with first through 16th right data RDATA<1:16> and then generates a first sensing signal SEN1. The first sensing signal SEN1 is generated in a high level if all of the first through 16th right data RDATA<1:16> from cells of the same address are at the same level.

The second sensing signal generator 11 executes an exclusive-NOR operation with first through 16th left data LDATA<1:16> and then generates a second sensing signal SEN2. The second sensing signal SEN2 is generated in a high level if all of the first through 16th left data LDATA<1:16> from cells of the same address are at the same level.

The selective transmission circuit 12 selectively transfers the first and second sensing signals, SEN1 and SEN2, in response to first and second selection signals TPARA<1> and TPARA<2>, respectively. For instance, if the first selection signal TPARA<1> is set on a high level, the selective transmission circuit 12 transfers an inverted signal of the first sensing signal SEN1. If the second selection signal TPARA<2> is set on a high level, the selective transmission circuit 12 transfers an inverted signal of the second sensing signal SEN2. The buffer circuit 13 buffers a signal transferred from the selective transmission circuit 12 and then outputs compression data CDATA. The first selection signal TPARA<1> is enabled in a high level to select the first through 16th right data RDATA<1:16>, while the second selection signal TPARA<2> is enabled in a high level to select the first through 16th left data LDATA<1:16>.

The compression data generator 1 with this configuration outputs an inverted signal of the first sensing signal SEN1 if the first selection signal TPARA<1> is in a high level and the second selection signal TPARA<2> is in a low level. Meanwhile, the compression data CDATA is generated in a low level if all of the first through 16th right data RDATA<1:16> are in the same level, i.e., which means that cells of the same address storing the first through 16th right data RDATA<1:16> are all determined as normal cells. Otherwise, if the first through 16th right data RDATA<1:16> are different from each other even in one bit, the compression data generator 1 determines there is a defective cell in the cells of the same address storing the first through 16th right data RDATA<1:

16> and then generates the compression data CDATA in a high level. In the meantime, the compression data generator 1 outputs an inverted signal of the second sensing signal SEN2 when the first and second selection signals, TPARA<1> and TPARA<2>, are set on low and high levels, respectively. Meanwhile, if the first through 16th left data LDATA<1:16> are all in the same level, i.e., if all of the cells of the same address storing the first through 16th left data LDATA<1:16> are all determined as normal cells, the compression data CDATA is generated in a low level. Otherwise, if the first through 16th left data LDATA<1:16> are different from each other even in one bit, the compression data generator 1 determines there is a defective cell in the cells of the same address storing the first through 16th left data LDATA<1:16> and generates the compression data CDATA in a high level. Thus, the compression data CATA includes information regarding cell inferiority, that is, one or more cells do not meet performance specifications.

Figure 4:
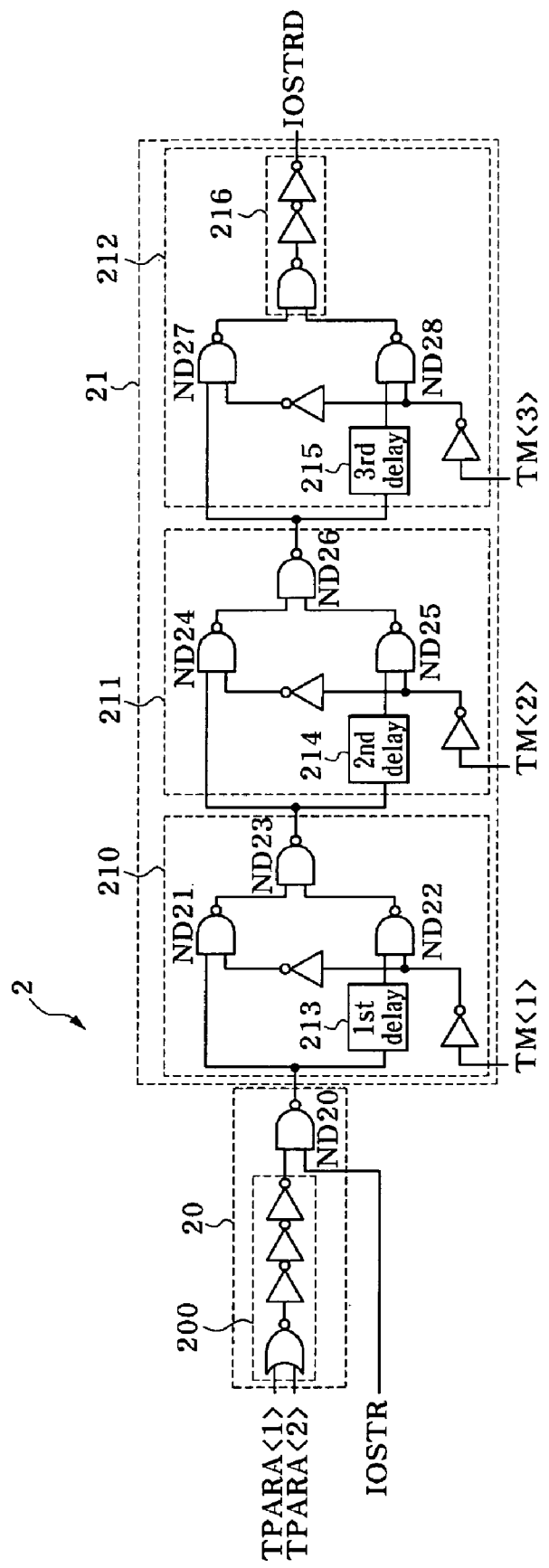
FIG. 4 is a circuit diagram of a strobe signal delayer included in the cell inferiority test circuit shown in FIG. 2.

The strobe signal delayer 2, referring to FIG. 4, is comprised of a strobe signal transmission circuit 20 and a delayed strobe signal generation circuit 21.

The strobe signal transmission circuit 20 includes a logic circuit 200 executing an OR operation with the first and second selection signals TPARA<1:2>, and a NAND gate ND20 acting as a transmission device for transferring a strobe signal IOSTR in response to an output signal of the logic circuit 200. The strobe signal transmission circuit 20 with this configuration transfers an inverted signal of the strobe signal IOSTR if one of the first and second selection signals TPARA<1:2> is enabled to a high level. Here, the strobe signal IOSTR is designed to go to a high level if at least one of the first and second selection signals TPARA<1:2> is enabled to a high level.

The delayed strobe signal generation circuit 21 includes a first strobe signal delay circuit 210, a second strobe signal delay circuit 211, and a third strobe signal delay circuit 212.

The first strobe signal delay circuit 210 is comprised of a NAND gate ND21 transferring an output signal of the strobe signal transmission circuit 20 in response to a first test signal TM<1>, a first delay unit 213 delaying the output signal of the strobe signal transmission circuit 20 by a predetermined amount of time, a NAND gate ND22 transferring an output signal of the first delay unit 213 in response to an inverted signal of the first test signal TM<1>, and a NAND gate ND23 effectively transferring output signals of the NAND gates ND21 and ND22 in response to the first test signal TM<1>. The first strobe signal delay circuit 210 with this configuration transfers the output signal of the strobe signal transmission circuit 20 through the NAND gates ND21 and ND23 if the first test signal TM<1> is at a high level. If the first test signal TM<1> is at a low level, the first strobe signal delay circuit 210 transfers the output signal of the strobe signal transmission circuit 20 through the delay circuit 213 and the NAND gates ND22 and ND23.

The second strobe signal delay circuit 211 is comprised of a NAND gate ND24 transferring an output signal of the first strobe signal delay circuit 210 in response to a second test signal TM<2>, a second delay unit 214 delaying the output signal of the first strobe signal delay circuit 210 in a predetermined amount of time, a NAND gate ND25 transferring an output signal of the second delay unit 214 in response to an inverted signal of the second test signal TM<2>, and a NAND gate ND26 effectively transferring output signals of the NAND gates ND24 and ND25 in response to the second test signal TM<2>. The second strobe signal delay circuit 211 with this configuration transfers the output signal of the first strobe signal delay circuit 210 through the NAND gates ND24 and ND26 if the second test signal TM<2> is at a high level. If the second test signal TM<2> is at a low level, the second strobe signal delay circuit 211 transfers the output signal of the first strobe signal delay circuit 210 through the delay circuit 214 and the NAND gates ND25 and ND26.

The third strobe signal delay circuit 212 is comprised of a NAND gate ND27 transferring an output signal of the second strobe signal delay circuit 211 in response to a third test signal TM<3>, a third delay unit 215 delaying the output signal of the second strobe signal delay circuit 211 by a predetermined amount of time, a NAND gate ND28 transferring an output signal of the third delay unit 215 in response to an inverted signal of the third test signal TM<3>, and a logic circuit 216 effectively transferring output signals of the NAND gates ND27 and ND28 as a delayed strobe signal IOSTRD in response to the third test signal TM<3>. The third strobe signal delay circuit 212 with this configuration transfers the output signal of the second strobe signal delay circuit 211 as the delayed strobe signal IOSTRD through the NAND gate ND27 and the logic circuit 216 if the third test signal TM<3> is at a high level. If the third test signal TM<3> is at a low level, the third strobe signal delay circuit 212 transfers the output signal of the second strobe signal delay circuit 211 as the delayed strobe signal IOSTRD through the third delay circuit 215, the NAND gate ND28, and the logic circuit 216.

Figure 5:
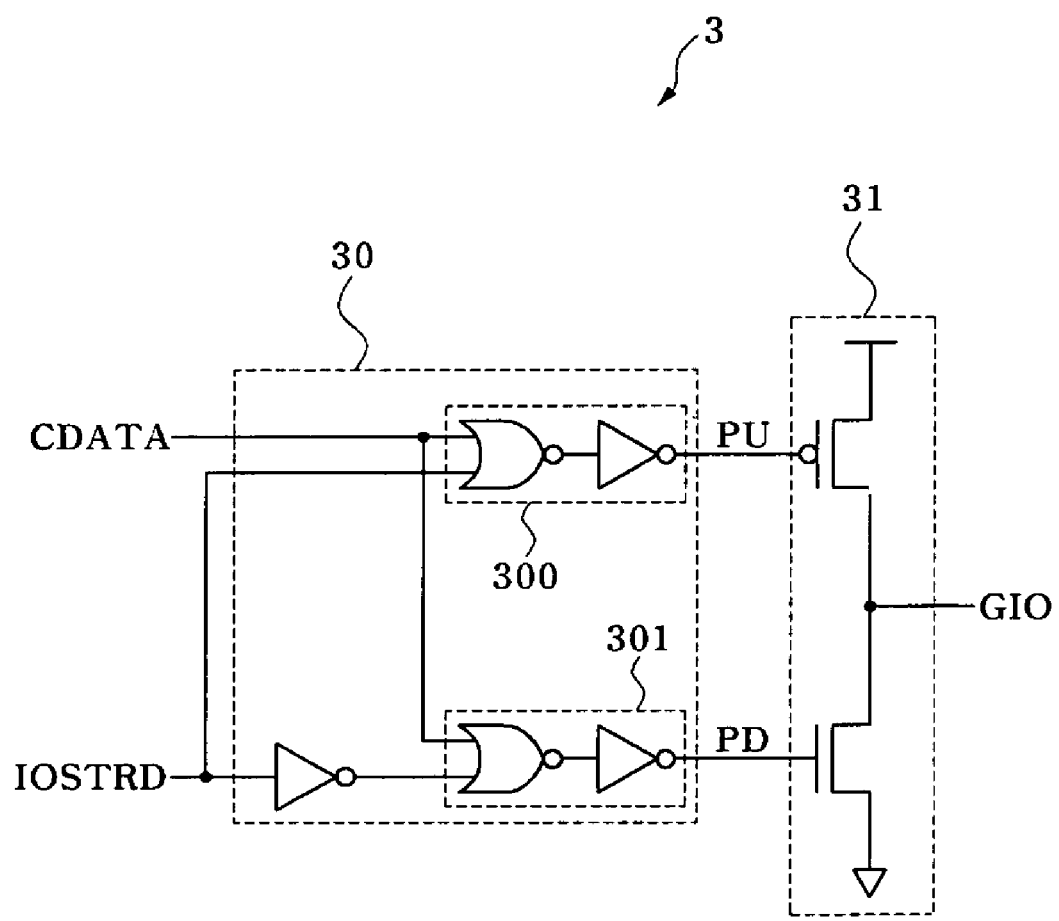
FIG. 5 is a circuit diagram of an input/output line driver included in the cell inferiority test circuit shown in FIG. 2.

The input/output line driver 3, referring to FIG. 5, is comprised of a drive signal generation circuit 30 and a drive circuit 31. The drive signal generation circuit 30 includes a logic circuit 300 generating a pull-up signal PU through an OR operation with the compression data CDATA and the delayed strobe signal IOSTRD, and a logic circuit 301 generating a pull-down signal PD through an OR operation with the compression data CDATA and an inverted signal of the delayed strobe signal IOSTRD. The drive circuit 31 functions to drive a global input/output line GIO in response to the pull-up and pull-down signals PU and PD.

Now operation of the cell inferiority test circuit is explained.

First, the compression data generator 1 outputs the compression data CDATA based on the first through 16th right data RDATA<1:16> or the first through 16th left data LDATA<1:16> depending on logical combinations of the first and second selection signals TPARA<1:2>. In more detail, if the first selection signal TPARA<1> is set at a high level while the second selection signal TPARA<2> is set at a low level, the inverted signal of the first sensing signal SEN1 is transferred as the compression data CDATA by way of the NAND gates ND10 and ND12 of the selective transmission circuit 12 and the buffer circuit 13. In this case, the compression data CDATA is generated in a low level if cells of the same address from which the first through 16th right data RDATA<1:16> are output are determined as normal cells. If the cells of the same address storing the first through 16th right data RDATA<1:16> are determined as including at least one defective cell, the compression data CDATA is generated in a high level. On the other hand, if the first selection signal TPARA<1> is at a low level while the second selection signal TPARA<2> is at a high level, the inverted signal of the second sensing signal SEN2 is transferred as the compression data CDATA by way of the NAND gates ND11 and ND12 of the selective transmission circuit 12 and the buffer circuit 13. In this case, the compression data CDATA is generated in a low level if cells of the same address from which the first through 16th left data LDATA<1:16> are output are determined as normal cells. If the cells of the same address storing the first through 16th left data LDATA<1:16> are determined as including at least one defective cell, the compression data CDATA is generated in a high level.

Next, the strobe signal delayer 2 generates the delayed strobe signal IOSTRD by delaying the strobe signal IOSTR in response to the first through third test signals TM<1:3> if the first or second selection signal, TPARA<1> or TPARA<2>, is set on a high level. In more detail, the strobe signal IOSTR, which is enabled in a high level when the first selection signal TPARA<1> or the second selection signal TPARA<2> is set on a high level, is delayed by a period established through the first strobe signal delay circuit 210, the second strobe signal delay circuit 211, and the third strobe signal delay circuit 212 and then output as the delayed strobe signal IOSTR. During this, a time at which the delayed strobe signal IOSTRD is enabled is dependent on combinational logic with the first through third test signals TM<1:3>. For instance, if both of the first and third test signals TM<1:3> are at high levels, a delay period through the first strobe signal delay circuit 210, the second strobe signal delay circuit 211, and the third strobe signal delay circuit 212 is set in the shortest to make an enabling time of the delayed strobe signal IOSTRD most advanced. Meanwhile, if both of the first and third test signals TM<1:3> are at low levels, the delay period through the first strobe signal delay circuit 210, the second strobe signal delay circuit 211, and the third strobe signal delay circuit 212 is set in the longest to make an enabling time of the delayed strobe signal IOSTRD most postponed.

Then, the input/output line driver 3 receives the compression data CDATA and the delayed strobe signal IOSTRD and drives the global input/output line GIO. In detail, if the compression data CDATA is conditioned in a low level, i.e., all of the cells of the same address from which data for generating the compression data CDATA are output are determined as normal cells, the pull-up signal PU is generated with a low level in a period when the delayed strobe signal IOSTRD is enabled in a low level, and the global input/output line GIO is driven in a high level. Therefore, a high level signal of the global input/output line GIO informs that all of the cells of the same address are normal cells without defects. On the other hand, if the compression data CDATA is conditioned in a high level, the global input/output line GIO is driven in a low level to inform that the cells of the same address include at least one defective cell.

As described above, the cell inferiority test circuit according to this embodiment is useful in processing a data compression test mode for finding out a defect from cells of the same address even in the environment of PVT variations, in which the first through third test signals TM<1:3> function to control an enabling time of the delayed strobe signal IOSTRD for the purpose of adjusting a timing margin between the compression data CDATA and the delayed strobe signal IOSTRD. For instance, if a timing margin between the compression data CDATA and the delayed strobe signal IOSTR is insufficient, at least one of the first through third test signals TM<1:3> transitions from high to low level is to delay the enabling time of the delayed strobe signal IOSTRD. Hence, it is possible to secure a sufficient timing margin between the compression data CDATA and the delayed strobe signal IOSTRD.

While the present invention has been described with respect to the specific embodiments, it will be apparent to those skilled in the art that various changes and modifications may be made without departing from the spirit and scope of the invention as defined in the following claims.

The present application claims priority to Korean application number 10-2009-0026044, filed on Mar. 26, 2009, which is incorporated by reference in its entirety.

What is claimed is:

1. A cell inferiority test circuit, comprising:
   a compression data generator configured to compress selected data in response to selection signal and to generate compression data including information about cell inferiority;
   a strobe signal delayer configured to delay a strobe signal by an amount of time set by a test signal and to generate a delayed strobe signal; and
   an input/output line driver configured to receive the compression data in sync with the delayed strobe signal and to drive a global input/output line.

2. The cell inferiority test circuit of claim 1, wherein the compression data generator generates the compression data by compressing right data if a first selection signal is enabled and by compressing left data if a second selection signal is enabled.

3. The cell inferiority test circuit of claim 2, wherein the compression data generator comprises:
   a first sensing signal generator configured to generate a first sensing signal enabled if the right data are at a same level;
   a second sensing signal generator configured to generate a second sensing signal enabled if the left data are at a same level; and
   a selective transmission circuit configured to transfer selectively the first and second sensing signals in response to the first and second selection signals.

4. The cell inferiority test circuit of claim 3, wherein the selective transmission circuit comprises:
   a first logic circuit configured to conduct a logical operation with an inverted signal of the first sensing signal and the first selection signal;
   a second logic circuit configured to conduct a logical operation with an inverted signal of the second sensing signal and the second selection signal; and
   a third logic circuit configured to conduct a logical operation with output signals of the first and second logic circuits.

5. The cell inferiority test circuit of claim 1, wherein, the strobe signal delayer comprises:
   a strobe signal transmission circuit configured to transfer the strobe signal in response to first and second selection signals; and
   a delayed strobe signal generation circuit configured to delay an output signal of the strobe signal transmission circuit for a delay period and to output a delayed strobe signal in response to the test signal.

6. The cell inferiority test circuit of claim 5, wherein the strobe signal transmission circuit comprises:
   a logic circuit configured to conduct a logical operation with the first and second selection signals; and
   a transmission device configured to buffer and transfer the strobe signal in response to an output signal of the logic circuit.

7. The cell inferiority test circuit of claim 5, wherein the delayed strobe signal generation circuit comprises:
   a first transmission device configured to transfer an output signal of the strobe signal transmission circuit in response to the test signal;
   a delay circuit configured to delay the output signal of the strobe signal transmission circuit in a predetermined delay period; and
   a second transmission device configured to transfer an output signal of the delay circuit in response to an inverted signal of the test signal; and a third transmission device configured to transfer selectively output signals of the first and second transmission devices in response to the test signal.

8. The cell inferiority test circuit of claim 5, wherein the strobe signal is enabled if one of the first and second selection signals is enabled.

9. The cell inferiority test circuit of claim 1, wherein the input/output line driver comprises:
a drive signal generation circuit configured to receive the compression data and the delayed strobe signal and to generate pull-up and pull-down signals; and
a drive circuit configured to receive the pull-up and pull-down signals and to drive the global input/output line.

10. The cell inferiority test circuit of claim 9, wherein the drive signal generation circuit comprises:
a first logic circuit configured to conduct a logical operation with the compression data and the delayed strobe signal and to generate the pull-up signal; and
a second logic circuit configured to conduct a logical operation with the compression data and an inverted signal of the delayed strobe signal and to generate the pull-down signal.

11. A cell inferiority test circuit, comprising:
a first strobe signal delay circuit configured to delay a strobe signal for a first delay period in response to a first test signal;
a second strobe signal delay circuit configured to delay an output signal of the first strobe signal delay circuit for a second delay period, in response to a second test signal, and to output a delayed strobe signal; and
an input/output line driver configured to receive compression data in sync with the delayed strobe signal and to drive a global input/output line.

12. The cell inferiority test circuit of claim 11, wherein the first strobe signal delay circuit comprises:
a first transmission device configured to transfer the strobe signal in response to the first test signal;
a delay unit configured to delay the strobe signal by a predetermined delay time;
a second transmission device configured to transfer an output signal of the delay unit in response to an inverted signal of the first test signal; and
a third transmission device configured to transfer selectively output signals of the first and second transmission devices in response to the first test signal.

13. The cell inferiority test circuit of claim 11, wherein the second strobe signal delay circuit comprises:
a first transmission device configured to transfer an output signal of the first strobe signal delay circuit in response to the second test signal;
a delay unit configured to delay the output signal of the first strobe signal delay circuit by a predetermined delay time;
a second transmission device configured to transfer an output signal of the delay unit in response to an inverted signal of the second test signal; and
a third transmission device configured to transfer selectively output signals of the first and second transmission devices in response to the second test signal.

14. The cell inferiority test circuit of claim 11, wherein the input/output line driver comprises:
a drive signal generation circuit configured to receive the compression data and the delayed strobe signal and to generate pull-up and pull-down signals; and
a drive circuit configured to receive the pull-up and pull-down signals and to drive the global input/output line.

15. The cell inferiority test circuit of claim 14, wherein the drive signal generation circuit comprises:
a first logic circuit configured to conduct a logical operation with the compression data and the delayed strobe signal and to generate the pull-up signal; and
a second logic circuit configured to conduct a logical operation with the compression data and an inverted signal of the delayed strobe signal and to generate the pull-down signal.

16. The cell inferiority test circuit of claim 11, further comprising:
a strobe signal transmission circuit configured to transfer the strobe signal to the first strobe signal delay circuit in response to first and second selection signals.

17. The cell inferiority test circuit of claim 16, wherein the strobe signal transmission circuit comprises:
a logic circuit configured to conduct a logical operation with the first and second selection signals; and
a transmission device configured to buffer and transferring the strobe signal in response to an output signal or the logic circuit.

* * * * *